Figure 1:
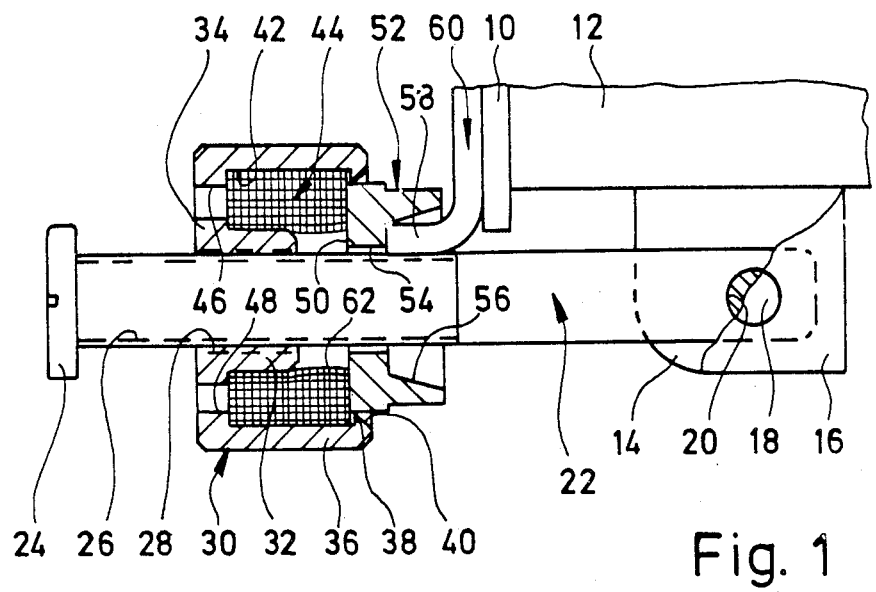

United States Patent [19]

Schaefer

[11] Patent Number: 4,530,530
[45] Date of Patent: Jul. 23, 1985

[54] LOCKING LATCH ASSEMBLY FOR MOUNTING AN ELECTRONIC COMPONENT DRAWER IN A RACK

[76] Inventor: Lothar F. Schaefer, Hummelbaum 22, D 7253 Renningen, Fed. Rep. of Germany

[21] Appl. No.: 422,874

[22] Filed: Sep. 23, 1982

[30] Foreign Application Priority Data

Sep. 29, 1981 [EP] European Pat. Off. ........ 81710048.0

[51] Int. Cl.³ .................. B65D 45/00; F16B 37/00
[52] U.S. Cl. .................... 292/256.75; 267/153; 411/427; 411/432; 411/544
[58] Field of Search .......... 292/256.73, 256.75, 292/176; 411/8–12, 14, 907; 70/85; 267/153, 137; 245/3

[56] References Cited

U.S. PATENT DOCUMENTS

| 183,290 | 4/1918 | Ensign et al. | 411/330 |
| 721,990 | 3/1903 | Young | 411/327 |
| 1,472,619 | 10/1923 | Starrett | 292/256.73 |
| 1,785,400 | 12/1930 | Watson | 292/256.73 |
| 2,345,364 | 3/1944 | Spafford | 292/256.73 |
| 2,658,710 | 11/1953 | Titus | 267/153 X |
| 2,766,799 | 10/1956 | Poupitch | 411/147 X |
| 2,966,187 | 12/1960 | Ter Cock | 411/330 |
| 3,060,786 | 10/1962 | Flower | 411/432 |
| 3,670,795 | 6/1972 | Kupfrian | 411/191 X |
| 3,756,640 | 9/1973 | Johnson | 292/256.75 |
| 3,907,157 | 9/1975 | Beattie | 292/256.75 X |

FOREIGN PATENT DOCUMENTS 2112587 9/1972 Fed. Rep. of Germany .
1345046 10/1963 France .

Primary Examiner—Robert L. Wolfe
Assistant Examiner—Lloyd A. Gall
Attorney, Agent, or Firm—Fred Philpitt

[57] ABSTRACT

In a locking latch assembly for mounting an electronic component drawer in a rack a clamping ring 30 is provided with plug and socket elements 46, 48 adapted to cooperate with a dynamometric key. An all metal hollow cylindrical spring cushion 44 is received within the cup-shaped clamping ring, a support stud 32 formed integral with the clamping ring 30 supporting the interior surface of the spring cushion along a portion of the axial extent thereof. The free end face of the spring cushion 44 forms a thrust bearing cooperating with a latch ring 52 adapted to receive a latch hook 60 fixed to the drawer. The clamp ring 30 runs on a threaded bolt 22 being in turn pivotally connected to drawer support rails 12 through a pivot pin 18.

12 Claims, 5 Drawing Figures

LOCKING LATCH ASSEMBLY FOR MOUNTING AN ELECTRONIC COMPONENT DRAWER IN A RACK

DESCRIPTION OF THE INVENTION

The invention relates to a locking latch assembly for mounting an electronic component drawer of the type disclosed in the German Utility Model Specification No. 74 11 107. In this known assembly a stack of Belleville-springs is arranged in the spring chamber of the clamp ring. Cooperating abutment shoulders are provided on the latch ring and the clamp ring to limit the axial operating range of the biassing spring, thus defining the desired clamping force of the latch assembly.

This known locking latch assembly is disadvantageous in that the clamping force cannot be precisely adjusted in a particular case, since commercial Belleville-springs do not have a precisely defined resiliency due to production tolerances. Furthermore, the clamping force of the assembly cannot be varied in a well defined manner, and vibrations and shocks acting on the latch assembly are not efficiently dampened, since a stack of Belleville-springs is not very well suited for purposes of vibration damping.

Another locking latch assembly for mounting an electronic component drawer in a rack is disclosed in the German Open-Laying Letter No. 21 12 587. In this known assembly an overtorque clutch is provided to limit the clamping moment. Also in this assembly a stack of Belleville-springs is provided to axially bias the latch ring. Thus, no effective damping of vibrations is obtained. In addition, this known assembly is of complex structure and expensive to produce, since the overtorque clutch must be machined in accordance with the exact regulations established for the main field of use for such latch assembly which is the mounting of electronic component drawers in an aircraft.

It is an object of the present invention to provide a locking latch assembly for mounting an electronic component drawer in a rack being of simple and rugged mechanical structure and yet providing good damping of vibrations.

This object is achieved in terms of the invention by providing a hollow, essentially cylindrical all metal spring cushion to axially bias the latch ring. The interior circumferential surface of the spring cushion is supported from a rigid stud along a portion of its axial extension. The support stud is carried by the bottom wall of the spring chamber formed in the clamp ring. The exterior circumferential surface of the spring cushion is supported from the circumferential exterior wall of the cupshaped clamp ring at least along part of its axial extension. The clamp ring in turn is provided with the plug or socket elements of a torque transmitting plug and socket connection, thus allowing rotation of the clamp ring using a dynamometric key. An all metal spring cushion is a mechanical component being known per se and has essentially continuous exterior surfaces. Seen from afar it appears as a solid element. More precisely the spring cushion has a structure corresponding to an oriented metal wire felt, which means that the individual continuous wires made from spring wire are not regularly arranged so as to define small cavities between the individual wires.

The present invention takes advantage of a property of the known spring cushions which is of no interest in the usual applications: a spring cushion has a specific microstructure of its surface. In an all metal spring cushion the spring wires forming the surface have at least a portion running parallel to the macroscopic surface. Thus, an essentially smooth bearing surface is obtained adapted to be displaced with respect to a smooth reaction surface overcoming very small frictional resistance, only. This feature is particularly advantageous in the locking latch assembly in accordance with the present invention, since the spring cushion can be rotated with respect to the latch ring without requiring an additional low friction ring interposed therebetween even if the clamp ring is tensioned so as to provide a high axial bias.

The present invention also profits from the fact that an all metal spring cushion suffers plastic as well as elastic deformation when exposed to large forces. Even after having been exposed to a large static deformation the spring cushion still provides good dynamic resiliency with respect to small alternating loads. Due to its feltlike structure the spring cushion is well adapted to absorb energy, and thus the vibrating system formed by the latch assembly and the drawer associated thereto has a broad and low resonance curve.

Since in accordance with the present invention the spring cushion is defined between circumferential walls of the clamp ring in both radial directions at least along part of its axial extension, the geometry of the exterior surfaces of the spring cushion cannot be varied in the respective portion of the cushion. Thus, this portion can suffer volume compression only. The portion of the spring cushion being not positively supported in radial direction can also be deformed in radial direction upon exerting of high axial load onto the spring cushion. By varying the ratio between the radially supported and the radially non-supported portion of the spring cushion, which can be easily achieved by modifying the clamp ring normally produced on a lathe, the overall spring characteristics of the latch assembly can be simply optimized in view of a particular application without having need to alter the spring cushion, the production process of which is quite complicated.

Since an all metal spring cushion shows a progressive spring characteristic, the clamping force of the latch assembly can be varied in a wide range. Such variation can be effected in very precise manner using a dynamometric key cooperating with the plug and socket elements provided on the clamp ring. Thus, the clamping moment can be very easily adjusted to the actual mass of the electronic component drawer to be fixed. After completion of the mounting procedure only mechanical components of very simple and rugged structure are left in the aircraft. Thus, failures due to breaking of a component thereof are practically eliminated.

In a latch assembly in accordance with the invention the spring cushion is connected to the clamp ring so as to form a single unit. Due to the specific geometry of the retaining bead, the spring cushion can be easily pushed into the spring chamber.

In a latch assembly in accordance with the invention practically the entire end face of the spring cushion contributes to transmitting the axial bias onto the latch ring. Thus, the available resilient volume of the spring cushion is effectively used.

The further improvement in accordance with the invention allows for modifications of the overall spring characteristics of the latch assembly by modifying the axial extension and the depth of the shallow groove receiving a bulging portion of the spring cushion formed under axial load.

The invention is particularly advantageous in view of a simple and compact structure of the clamp ring, since the support stud radially supporting the interior surface of the spring cushion simultaneously forms an extended basis carrying the threadings of the clamp ring cooperating with the threaded bolt pivotally connected to the rack. The invention is advantageous in that a support stud of relatively small axial extension can be used, a sufficient number of threading turns being still available to transmit the reaction force from the clamp ring to the threaded bolt.

The invention is also advantageous in view of varying the overall spring characteristics of the unit formed by the clamp ring and the spring cushion retained therein without having need to modify the spring cushion.

In accordance with the invention the overall spring characteristics of the latch assembly can be varied by simply modifying the geometry of lathe workpieces.

In a latch assembly in accordance with the invention, the end face of the spring cushion and the opposing end face of the latch ring are adapted for relative movement overcoming very small frictional forces only, even if large axial forces are transmitted.

If a spring cushion having the characteristics set forth herein is used, particularly favorable spring and vibration damping characteristics are obtained as to vibration and shocks currently experienced in a high velocity jet propelled aircraft.

If the materials of the latch ring and the spring cushion are chosen in accordance with the invention, the formation of rough surface portions is eliminated and existing surface roughness will average out by microflow of material.

Figure 2:
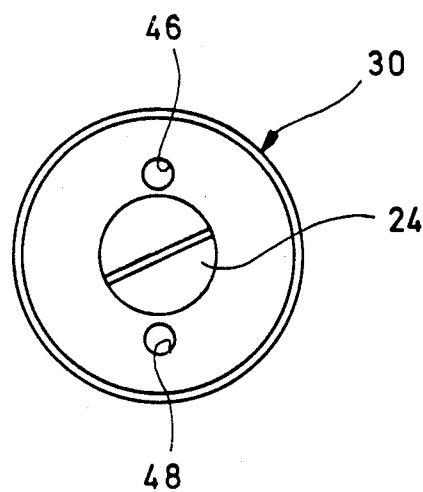
Figure 3:
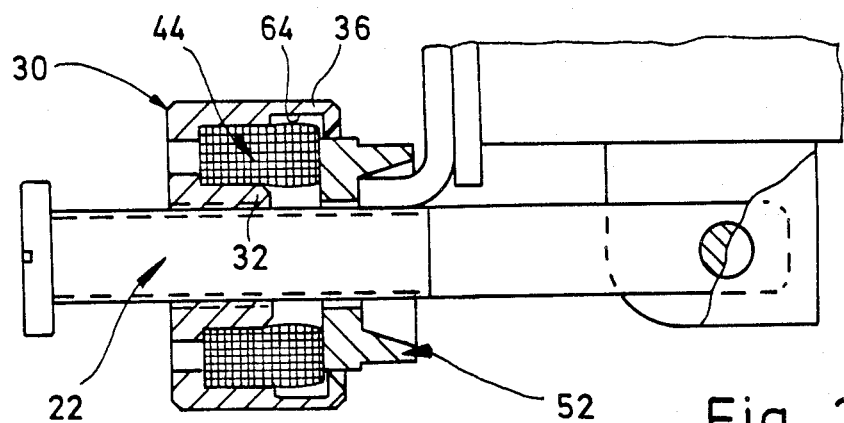
Figure 4:
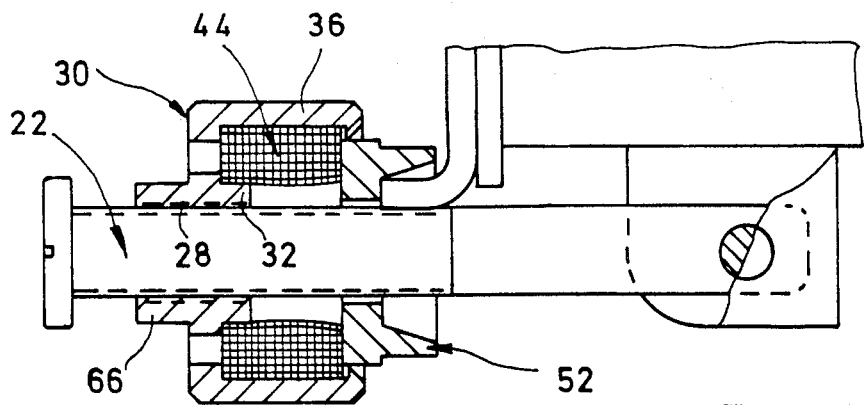
Figure 5:
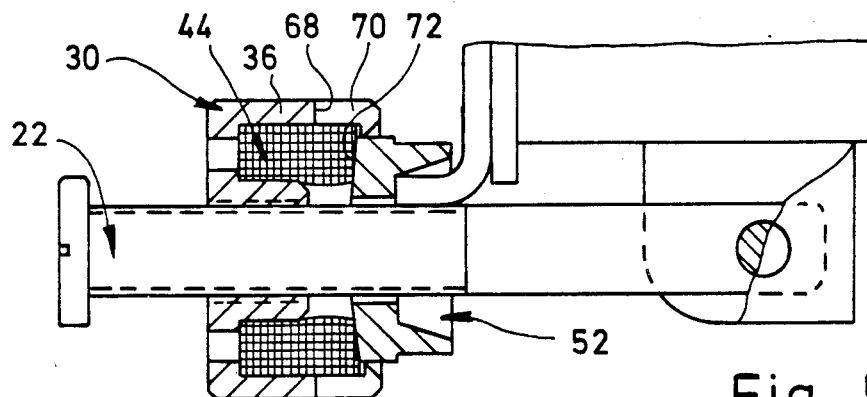

The invention will now be described in more detail referring to the drawings. Therein FIG. 1 is an elevational view of a locking latch assembly for mounting an electronic component drawer in the rack of an aircraft, a clamp ring, an all metal spring cushion and a latch ring of the assembly being shown in axial section;

FIG. 2 is an axial elevational view of the end face of the latch assembly of FIG. 1; and FIGS. 3 to 5 are views similar to the one of FIG. 1 showing modified locking latch assemblies.

In FIG. 1 the front plate of an electronic component drawer of an aircraft is shown at 10. Drawer support rails 12 are part of a rack of the aircraft thus being rigidly connected thereto. Brackets 14, 16 are fixed to the lower surface of the support rails 12, a pivot pin 18 being carried thereby.

The pivot pin 18 extends through an opening 20 for relative rotational movement. The opening 20 is provided adjacent to the free end of a threaded bolt 22 extending therethrough in transverse direction. A screw 24 is threaded into the lefthand end of the threaded bolt as seen in FIG. 1 and is secured in position by a suitable adhesive.

The threaded bolt 22 has threadings 26 cooperating with threadings 28 of a cup-shaped clamp ring 30. More particularly the threadings 28 are provided on the interior surface of a central cylindrical support stud 32 formed integral with a bottom wall 34 of the clamp ring 30. The axial extension of the support stud 32 is about 60% of the axial extension of a circumferential wall 36 of the clamp ring.

A retaining bead 38 is carried by the free edge of the circumferential wall 36 extending in a radial inward direction. The bead 38 is formed with a conical surface 40.

The circumferential wall 36 defines a spring chamber 42 extending to an end face of the bottom wall 34 receiving an all metal spring cushion 44. The macroscopic shape of the spring cushion corresponds to a cylindrical sleeve. The spring cushion is obtained by compacting a circular knit tubular hose made from Cr-Ni-spring wire material using a press mold. The compacted material has a density of about 2 g/cm$^3$. If the microstructure of the spring cushion is seen in more detail, it will be noted that the individual endless wires are undulated and generally extend in a circumferential direction of the spring cushion. The exterior diameter of the spring cushion 44 corresponds to the inner diameter of the circumferential wall 36. The inner diameter of the spring cushion 44 corresponds to the outer diameter of the support stud 32. The axial dimension of the undeformed spring cushion 44 corresponds to the distance defined between the bottom wall 34 of the clamp ring 30 and the retaining bead 38.

Two diametrically opposing bores 46, 48 are provided in the bottom wall 34 of the clamp ring 30 which are adapted to receive driving pins of a dynamometric key or spanner not shown.

The free end face of the spring cushion 44 engages the smooth plain end face 50 of a latch ring 52 having a central through-bore 54 receiving the threaded bolt 22 for free axial movement. The latch ring 52 has a conical counterbore 56 being aligned with the through-opening 54 and adapted to receive an end portion 58 of a latch hook 60 fixed to the front plate 10 of the drawer.

The outer diameter of the latch ring 52 is chosen so as to obtain small radial play between the clamp ring 30 and the retaining bead 38. Thus, the end face 50 of the latch ring 52 overlies almost the entire end face of the spring cushion 44.

The locking latch assembly for mounting an electronic component drawer in a rack is produced as described below:

The threaded bolt 22, the clamp ring 30 and the latch ring 52 are made from steel material having the required mechanical properties using a lathe. The spring cushion which has been made from a circular knit wire steel tubular workpiece is then pushed into the spring chamber 42 passing the retaining bead 38 under radial elastic deformation. Thereafter, the clamp ring 30 is mounted on the threaded bolt 22 and is secured against removal by mounting screw 24 and by permanently securing the latter using an adhesive. The latch ring 52 can be mounted on the threaded bolt 22 together with the clamp ring 30 or is fit on the threaded bolt 22 from the free end thereof.

By fitting the pivot pin 18 in the brackets 14, 16 and the bore 20 the threaded bolt 22 is connected to the drawer support rails 12. After the drawer has been inserted on and between the drawer rails 12 the clamp ring 30 is manually advanced towards the front plate 10. When force transmitting engagement conditions between the latch hook 60, the clamp ring 30 and the latch ring 52 are encounted, a dynamometric key is connected to the bores 46, 48 of the clamp ring 30. Using this key the clamp ring 30 is fastened until the desired clamping moment established in the dynamometric key is reached.

The clamping or tensioning movement of the clamp ring 30 causes the end face 50 of the latch ring 52 to move into the spring chamber 42, as can be seen from FIG. 1. Thus the material of the spring cushion experiences an axial compressive load. Part of the spring cushion being not supported in the radial inward direction and situated in the righthand portion of the spring chamber as seen in FIG. 1 will form a bulging cushion portion as shown at 62.

FIGS. 3 to 5 illustrate different ways for modifying the overall spring characteristics of the latch assembly by mere modification of the clamp ring 30 and/or the latch ring 52, both of these components being lathe workpieces which can be altered easily.

In the clamp ring 30 in accordance with FIG. 3 the right-hand portion of the circumferential wall 36 is formed with a shallow radial groove 64 communicating with the spring chamber 42 and thus allowing radial bulging of the spring cushion also at the outer circumferential surface of the spring cushion.

In the clamp ring 30 in accordance with FIG. 4 the space provided for forming bulging portions of the spring cushion 44 is enhanced in the axial direction by reducing the axial dimension of the support stud 32. In order to still retain a sufficient number of runs of threadings 28 a threaded sleeve 66 is formed integral with the bottom wall 34 of the clamp ring 30 axially projecting from the end face thereof.

In the clamp ring 30 in accordance with FIG. 5 radial outward bulging of the righthand portion of the spring cushion 44 under axial load is obtained by providing slots 68 in the circumferential wall 36 of clamp ring 30. Slots 68 extend to the free edge of the clamp ring 30 intersecting the retaining bead 38 so as to define a plurality of regularly distributed legs 70 which can be elastically bent in the radial outward direction. The overall spring characteristics of the latch assembly can thus be simply varied by modifying the number and the axial dimension of the slots 68.

In the embodiment shown in FIG. 5 the latch ring 52 is furthermore formed with a slightly conical end face 72, the apex angle of the end face providing a further parameter for simply modifying the spring characteristics of the latch assembly in view of a particular application without having need to alter the geometry of the clamp ring 30 and using a standard spring cushion.

In the drawings the individual spring wires of the spring cushion 44 are only shown schematically and are indicated only for sectional views of the spring cushion in order to more clearly show the deformation of the spring cushion under operational conditions. Of course, in practice the spring wires are not arranged perfectly regularly.

The locking latch assemblies described above each comprise simple and rugged mechanical components only, i.e. a spring cushion, a threaded bolt, a clamp ring and a latch ring. The clamping force can be very precisely adjusted using a dynamometric key. Thus, the resonance frequency of the vibratory system formed by the electronic component drawer and the latch assembly can be easily adjusted to a value not coinciding with a resonance frequency of the aircraft taking into account the actual mass of the drawer considered. Furthermore, the overall spring characteristics of the latch assembly can be varied in a wider range as compared to the bias range compatible with a given spring cushion by simple geometric modifications of the clamp ring and/or the latch ring. Such modifications present no difficulties in practice, since both of these components are simple lathe workpieces.

I claim:

1. A locking latch assembly for mounting an electronic component drawer in a rack, comprising
   (a) a threaded bolt including joint means for pivotal connection to a rack, the pitch of the threadings of the threaded bolt being chosen so as to warrant self-locking under axial loads established under operational conditions,
   (b) a threaded clamp ring carried on the threaded bolt and including a spring chamber extending to one end face of the clamp ring,
   (c) spring means arranged in the spring chamber and
   (d) a latch ring arranged on the threaded bolt between the clamp ring and the joint means for free axial movement and including a conical counterbore flaring towards the free end of the threaded bolt and adapted to receive a latch hook of the drawer, the end face of the latch ring facing the clamp ring engaging the spring means, characterized in that
   (e) said spring means comprise a generally cylindrical sleeve-shaped all metal cushion,
   (f) said spring cushion is arranged between an outer circumferential wall of the spring chamber and a support stud axially projecting from a bottom wall of the spring chamber so as to provide a close fit therebetween in the radial direction only along a portion of its axial extension, and
   (g) said clamp ring is formed with first elements of a claw coupling adapted to cooperate with second complementary elements provided on a dynamometric key.

2. The assembly in accordance with claim 1 characterized in that a retaining bead having a flaring end face is provided on the clamp ring adjacent to a free end of the spring chamber, said bead projecting from the circumferential wall of the clamp ring in a radial inward direction and allowing insertion of the spring cushion into the spring chamber under elastic deformation.

3. The assembly as in claim 1, characterized in that the end face of the latch ring is adapted to be moved into the spring chamber under small play.

4. The assembly as in claim 1, characterized in that a shallow groove is provided in the circumferential wall of the spring chamber extending over a portion of the axial extension of the spring chamber.

5. The assembly as in claim 1, characterized in that the support stud includes at least a portion of the threadings of the clamp ring cooperating with the threaded bolt.

6. The assembly as in claim 1, characterized in that a portion of the threadings of the clamp ring cooperating with the threaded bolt is provided on a threaded sleeve axially projecting from the bottom wall of the clamp ring.

7. The assembly as in claim 1, characterized in that the circumferential wall of the spring chamber has slots formed therein adjacent to the free end thereof and extending thereto.

8. The assembly as in claim 1, characterized in that the end face of the latch ring facing the clamp ring is made conical.

9. The assembly as in claim 1, characterized in that the metal wires of the spring cushion are undulated, their main extension being oriented in a circumferential direction.

10. The assembly as in claim 1, characterized in that the spring cushion is made from circular knit Cr-Ni-steel wire fabric by compacting to a final density of about 2 g/cm$^3$, the diameter of the steel wire being about 0.2 mm.

11. The assembly as in claim 10, characterized in that the latch ring is also made from steel material.

12. A locking latch assembly for mounting an electronic component drawer in a rack, comprising
   (a) a threaded bolt including joint means for pivotal connection to a rack, the pitch of the threadings of said threaded bolt insuring self-locking under axial loads established under operating conditions,
   (b) a cup-shaped, threaded clamp ring carried on said threaded bolt, including a spring chamber extending to one end face of said clamp ring, and being formed with elements of a claw coupling adapted to cooperate with complementary elements provided on a dynamometric key,
   (c) a latch ring arranged on said threaded bolt between said clamp ring and said joint means for free axial movement and including a conical counterbore flaring towards the free end of the threaded bolt and adapted to receive a latch hook of the drawer, an end face of the latch ring facing the clamp ring, and
   (d) spring means comprising a generally cylindrical sleeve-shaped metal cushion arranged in said spring chamber between an outer circumferential wall of said spring chamber and an inner support stud axially projecting from a bottom wall of said spring chamber so as to provide a close radial fit therebetween along only a portion of the axial length of said cushion spring, one end face of said cushion spring being adapted to engage the adjacent end face of said latch ring and provide a friction bearing surface.

* * * * *